United States Patent

Barnowski et al.

[11] Patent Number: 6,059,510
[45] Date of Patent: May 9, 2000

[54] DEVICE FOR FEEDING ELECTRIC COMPONENTS TO AN ASSEMBLY AUTOMATON

[75] Inventors: Frank Barnowski; Mohammad Mehdianpour, both of München, Germany

[73] Assignee: Siemens Aktiengesellschaft, Munich, Germany

[21] Appl. No.: 09/331,024
[22] PCT Filed: Jan. 7, 1998
[86] PCT No.: PCT/DE98/00032
§ 371 Date: Jun. 15, 1999
§ 102(e) Date: Jun. 15, 1999
[87] PCT Pub. No.: WO98/31206
PCT Pub. Date: Jul. 16, 1998

[30] Foreign Application Priority Data

Jan. 13, 1997 [DE] Germany ............... 197 00 841

[51] Int. Cl.⁷ .................................. H05K 13/04
[52] U.S. Cl. .............. 414/403; 242/557; 242/591; 242/598.1
[58] Field of Search .............. 414/403; 242/557, 242/598.1, 591

[56] References Cited

U.S. PATENT DOCUMENTS 4,044,964  8/1977  Kellett ................... 242/598.1
5,515,600  5/1996  Iwasaki et al. .

FOREIGN PATENT DOCUMENTS 0 599 319 A1  6/1994  European Pat. Off. .
38 05 781 A1  9/1988  Germany .
41 37 191 A1  5/1993  Germany .
636156        3/1962  Italy ...................... 242/557

*Primary Examiner*—Steven A. Bratlie
*Attorney, Agent, or Firm*—Hill & Simpson

[57] ABSTRACT

The delivery device is provided with sword-like flat parts (2) at which reels (6) having component belts (7) are individually held. The flat parts (2) are guided between circular guide disks (3) at their base end, the circular guide disks (3) being slipped onto a swiveling axis. As a result thereof, the operation of the delivery means is facilitated.

2 Claims, 1 Drawing Sheet

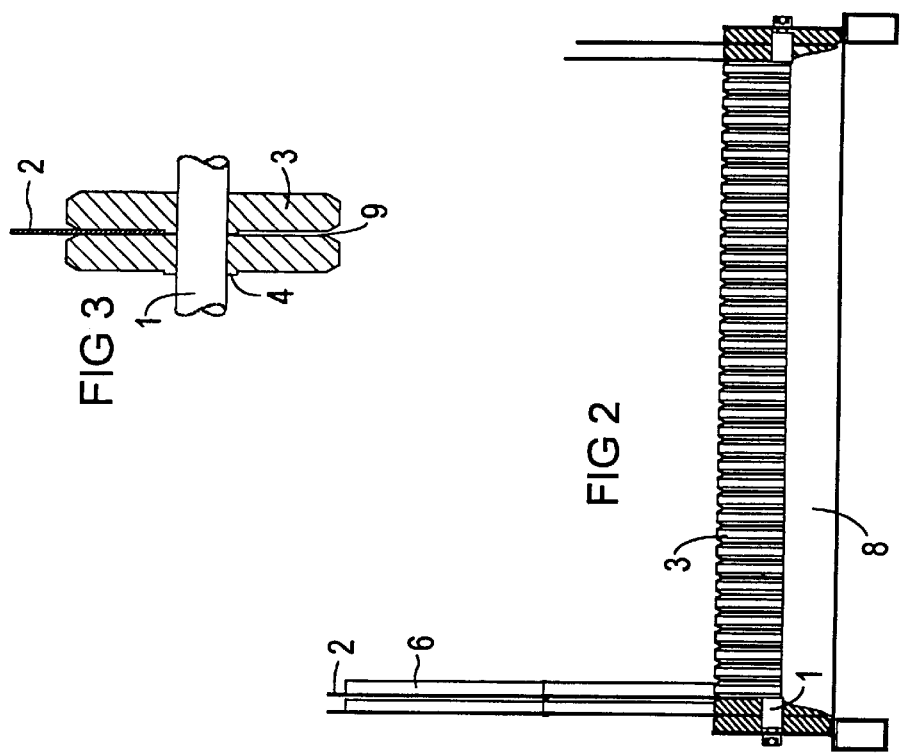
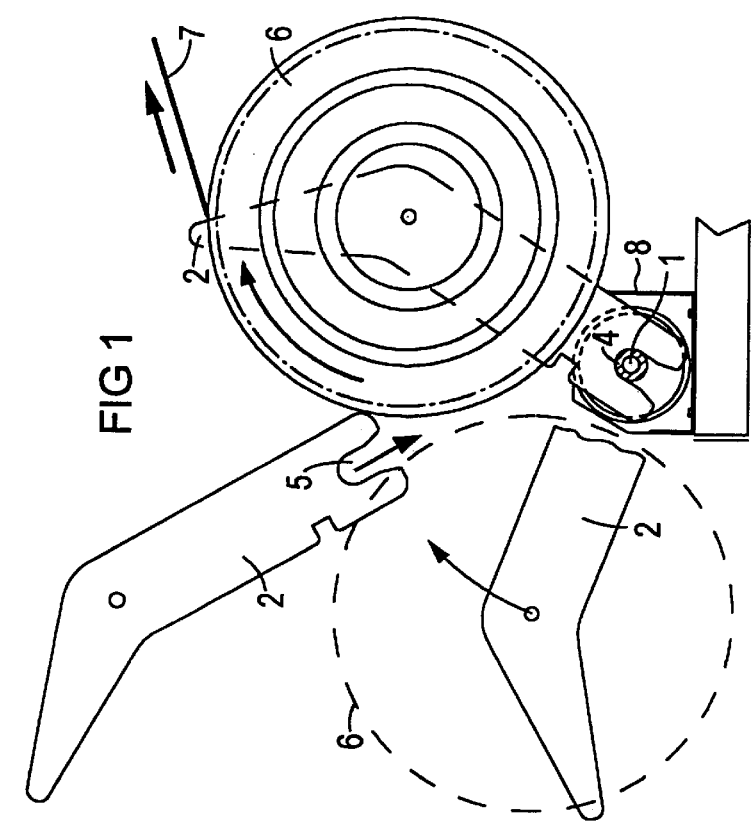

DEVICE FOR FEEDING ELECTRIC COMPONENTS TO AN ASSEMBLY AUTOMATON

BACKGROUND OF THE INVENTION

The invention is directed to a delivery means for delivering electrical components to an automatic equipping unit for equipping electrical printed circuit boards.

Such a delivery means has been disclosed, for example, by EP 0 599 319 B1. In accord therewith, the delivery means comprises a magazine for reels with component part belts, whereby the reels can be joined to one another in a stack-like configuration in axial direction. The reels are individually held at sheet-like flat parts that are seated at the delivery means pivotable around a swiveling axis. The flat parts have their bearing location provided with a slot-like recess into which the swiveling axis engages. In the proximity of the swiveling axis, the delivery means comprises comb-like guide plates for the flat parts that are provided with lateral guide slots. A further comb-like guide part is arranged on the other end of the flat parts, so that these can be laterally held at two locations.

The invention is based on the object of structurally simplifying the delivery means and simplifying the operation thereof.

SUMMARY OF THE INVENTION

In general terms the present invention is a delivery means for delivery of electrical components to an automatic equipping unit for equipping electrical printed circuit boards. The delivery means is provided with a magazine for reels with component belts. The reels adjoin one another in an axial direction. The reels are individually held at sheet-metal-like flat parts that are seated swivellable around a swiveling axis at the delivery means. The flat parts are fashioned fork-like at their bearing location and are provided with a slot-like recess into which the swiveling axis engages. The delivery means is provided with lateral guide slots in the proximity of the swiveling axis, the flat parts projecting ant heir function position into the lateral guide slots. The guide slots are fashioned between guide disks that have a central bore slipped onto the swiveling axis and that are placed adjoining one another. The ring-like spacer elements, whose thickness is at least equal to the thickness of the flat parts, are arranged between the guide disks. The width of the recess is greater than the diameter of the spacer elements.

The preferably circular guide disks can be plugged onto the swiveling axis in alternating sequence with the spacer elements and can be secured between lateral supports of the swiveling axis. The spacer elements can, for example, be fashioned as separate spacer disks or can be connected of one piece to the guide disks. A guide length for the flat parts having the approximate diameter of the guide disks derives between the spacer disks. This guide length suffices in order to forego additional guides, for example at the other end of the flat parts.

After being plugged in, the flat parts are adequately guided in every swivelled attitude. For replacing reels, individual flat parts together with the reels can be swivelled out of their haul-off position broad-angled and can be subsequently swivelled back in without a threading procedure.

In an advantageous development of the present invention the flat parts project at least slightly beyond the reels and, proceeding from the center axis of the reel, are fashioned proceeding outwardly bent off opposite the haul-off direction of the belts.

As a result the free ends of the flat parts can remain outside the belt haul-off plane and are easily accessible for the purpose of being swivelled out.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 shows a partial side view of a delivery means for electronic component parts;

FIG. 2 shows a different side view of the delivery means according to FIG. 1;

FIG. 3 shows a magnified partial section through the delivery means according to FIG. 2.

DESCRIPTION OF THE PREFERRED EMBODIMENTS

According to FIGS. 1, 2 and 3, a delivery means is provided with a swiveling axis 1 on which reel holders fashioned as sheet-metal-like flat parts 2 are pivotably seated. Circular guide disks 3 are inserted over the swiveling axis, annular spacer elements 4 having the thickness of the flat parts 2 being arranged between said guide disks 3. The spacer elements 4 yield correspondingly wide guide slots 9 between the guide disks 3 into which the flat parts 2 can be introduced with little play. The flat parts 2 fashioned sword-like are provided with a recess 5 at their fork-like end overlapping the swiveling axis 1, the width of said recess 5 being equal to the diameter of the spacer elements. With this end, the flat part can be plugged over the swiveling axis 1 with the spacer element 4 between the guide disks and is thus laterally guided over an adequate clamping length.

In FIG. 1, the flat parts are shown in three different positions, whereby the right-hand flat part is shown in the function position with a reel 6 secured thereto, a component belt 7 being hauled off therein to a delivery module in the indicated arrow direction. The left-hand swivelled position shows the swivelled-out attitude of the individual flat parts 2 capable of being swivelled. In this position, the reels 6 are swivelled out to such an extent that they no longer project between the other reels 6. The middle flat part 2 is shown in its plug-in position wherein it can have the fork-like end plugged between the guide disks 3 from the outside according to the indicated arrow direction.

The swivel motions are limited by a stop plate 8 bent U-shaped that extends along the guide disks 3 adjoining one another and is provided with lateral legs of different height against which the flat parts 2 strike.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A delivery apparatus for delivery of electrical components to an automatic equipping unit for equipping electrical printed circuit boards, comprising:

a magazine for reels with component belts, said reels adjoining one another in an axial direction;

the reels being individually held at sheet-metal-like flat parts that are seated swivellable around a swiveling axis at the delivery apparatus;

each of the flat parts having a bearing location that has a fork-like structure and, having a slot-like recess into which the swiveling axis engages;

lateral guide slots in proximity of the swiveling axis, the flat parts projecting in a function position thereof into said lateral guide slots;

the guide slots formed between guide disks that have a central bore slipped onto the swiveling axis and that are placed adjoining one another;

ring-like spacer elements, each of which having a thickness is at least equal to a thickness of the flat parts, arranged between the guide disks; and a width of the slot-like recess being greater than a diameter of the spacer elements.

2. The delivery apparatus according to claim 1, the flat parts project at least slightly beyond the reels and, proceeding from a center axis of the reel, are oriented proceeding outwardly bent off opposite a haul-off direction of the belts.

* * * * *